(12) United States Patent
Cheng et al.

(10) Patent No.: US 10,516,064 B1
(45) Date of Patent: Dec. 24, 2019

(54) MULTIPLE WIDTH NANOSHEET DEVICES

(71) Applicant: INTERNATIONAL BUSINESS MACHINES CORPORATION, Armonk, NY (US)

(72) Inventors: Kangguo Cheng, Schenectady, NY (US); Lawrence A. Clevenger, Saratoga Springs, NY (US); Carl Radens, LaGrangeville, NY (US); Junli Wang, Slingerlands, NY (US); John H. Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/103,283

(22) Filed: Aug. 14, 2018

(51) Int. Cl.
| | | |
|---|---|---|
| *H01L 29/786* | (2006.01) | |
| *H01L 29/06* | (2006.01) | |
| *H01L 29/423* | (2006.01) | |
| *H01L 27/088* | (2006.01) | |
| *H01L 29/66* | (2006.01) | |
| *H01L 29/40* | (2006.01) | |
| *H01L 29/417* | (2006.01) | |

(52) U.S. Cl.
CPC ...... *H01L 29/78696* (2013.01); *H01L 27/088* (2013.01); *H01L 29/0673* (2013.01); *H01L 29/401* (2013.01); *H01L 29/41733* (2013.01); *H01L 29/42392* (2013.01); *H01L 29/66742* (2013.01)

(58) Field of Classification Search
CPC ......... H01L 29/78696; H01L 29/41733; H01L 29/401; H01L 29/66742; H01L 29/42392; H01L 29/0673; H01L 27/088
See application file for complete search history.

(56) References Cited

U.S. PATENT DOCUMENTS

| | | | |
|---|---|---|---|
| 8,778,768 B1 | 7/2014 | Chang et al. | |
| 9,287,357 B2 | 3/2016 | Rodder et al. | |
| 9,431,388 B1* | 8/2016 | Gauthier, Jr. | ....... H01L 27/0255 |
| 9,570,609 B2 | 2/2017 | Obradovic et al. | |
| 9,660,028 B1* | 5/2017 | Cheng | ................. H01L 29/0673 |
| 9,673,279 B2 | 6/2017 | Lee et al. | |
| 9,847,390 B1 | 12/2017 | Xie et al. | |
| 9,899,387 B2 | 2/2018 | Ching et al. | |
| 2014/0239255 A1* | 8/2014 | Kang | ..................... H01L 29/775 257/24 |
| 2016/0071729 A1 | 3/2016 | Hatcher et al. | |
| 2016/0284604 A1* | 9/2016 | Chang | ............. H01L 21/823807 |
| 2017/0221893 A1 | 8/2017 | Tak et al. | |
| 2017/0256611 A1 | 9/2017 | Kim et al. | |
| 2018/0061992 A1 | 3/2018 | Bergendahl et al. | |
| 2018/0090624 A1* | 3/2018 | Cheng | ............... H01L 29/78696 |
| 2019/0181224 A1* | 6/2019 | Zhang | ................. H01L 29/0673 |

* cited by examiner

*Primary Examiner* — Yasser A Abdelaziez
(74) *Attorney, Agent, or Firm* — Cantor Colburn LLP; Grant Johnson

(57) ABSTRACT

A technique relates to a semiconductor device. A first stack includes a first plurality of nanowires respectively coupled to first source and drain regions, and a second stack includes a second plurality of nanowires respectively coupled to second source and drain regions. First source and drain contacts couple to a first predefined number of the first plurality of nanowires. Second source and drain contacts to couple to a second predefined number of the second plurality of nanowires, wherein the first predefined number is different from the second predefined number.

20 Claims, 16 Drawing Sheets

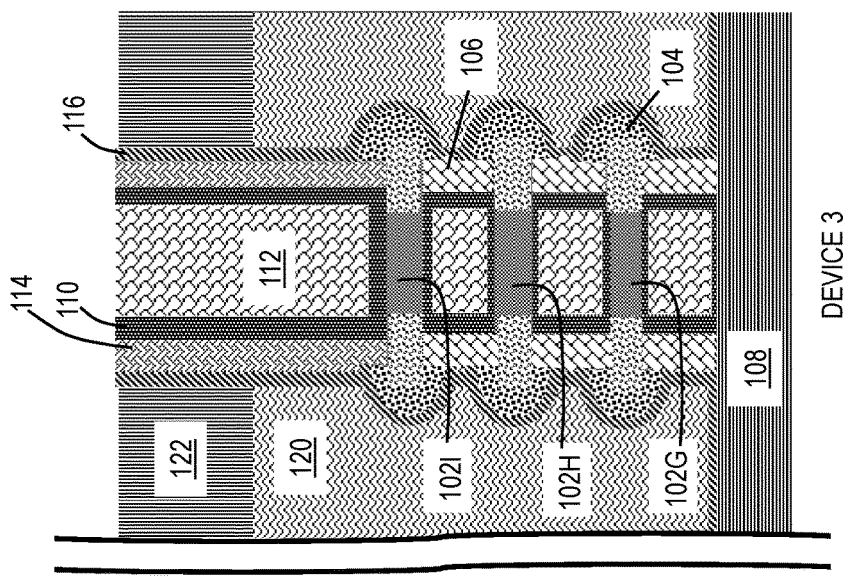

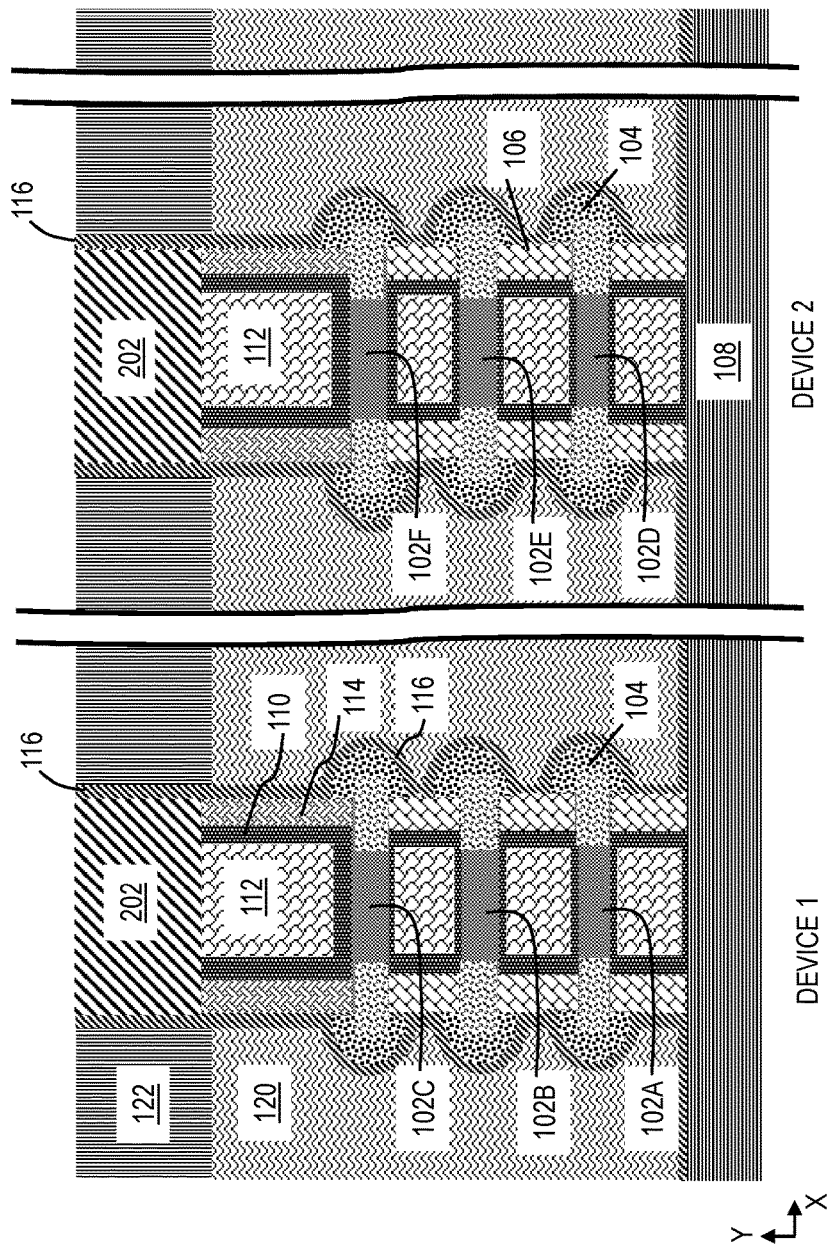

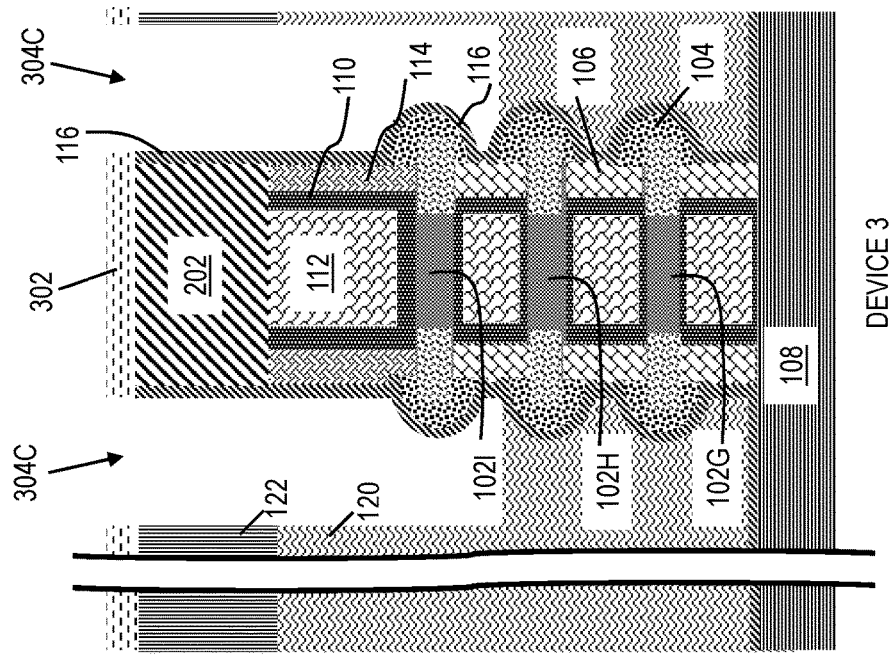

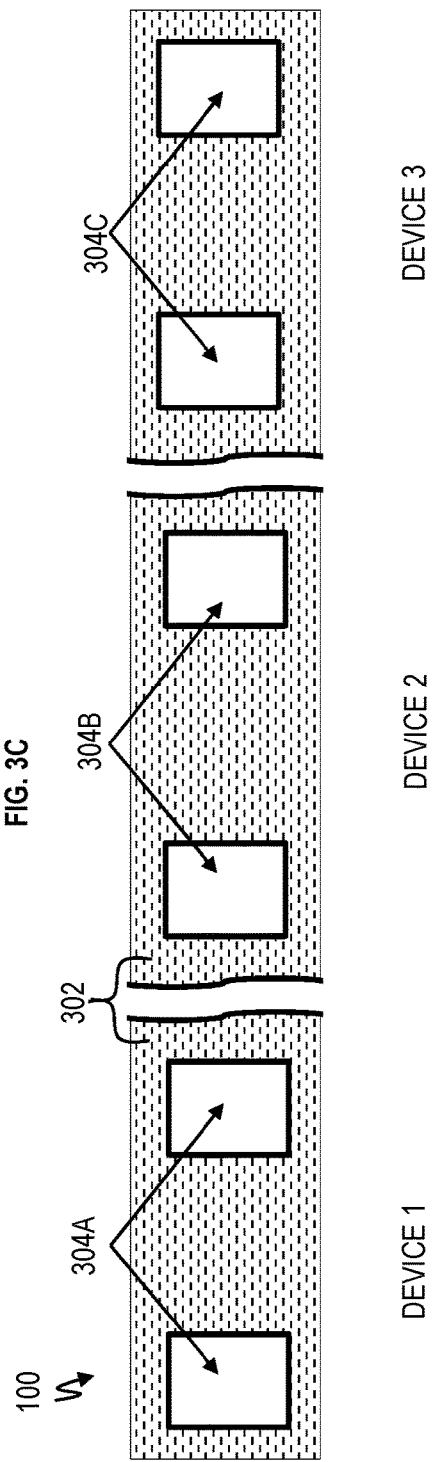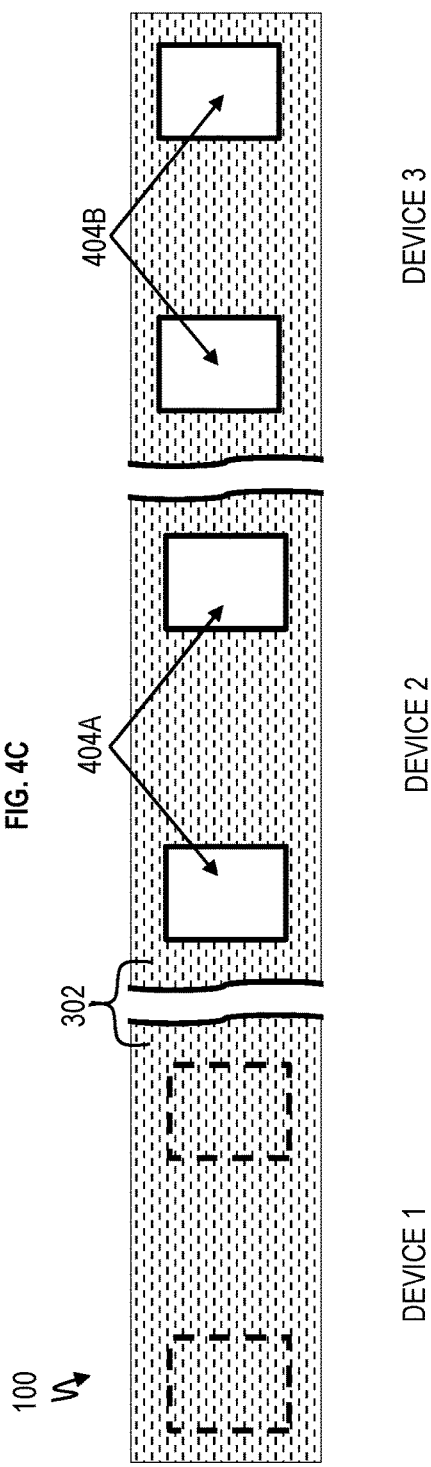

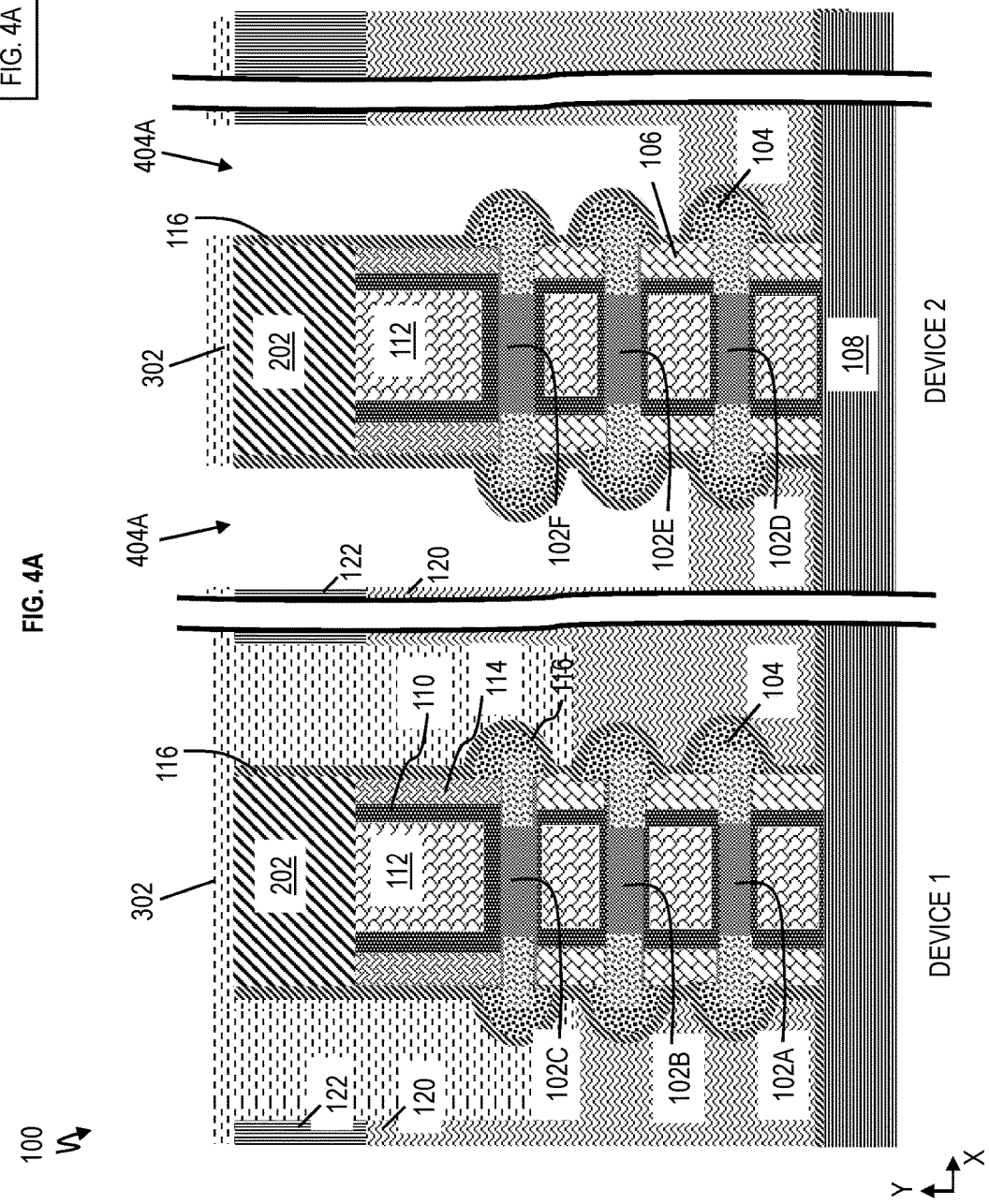

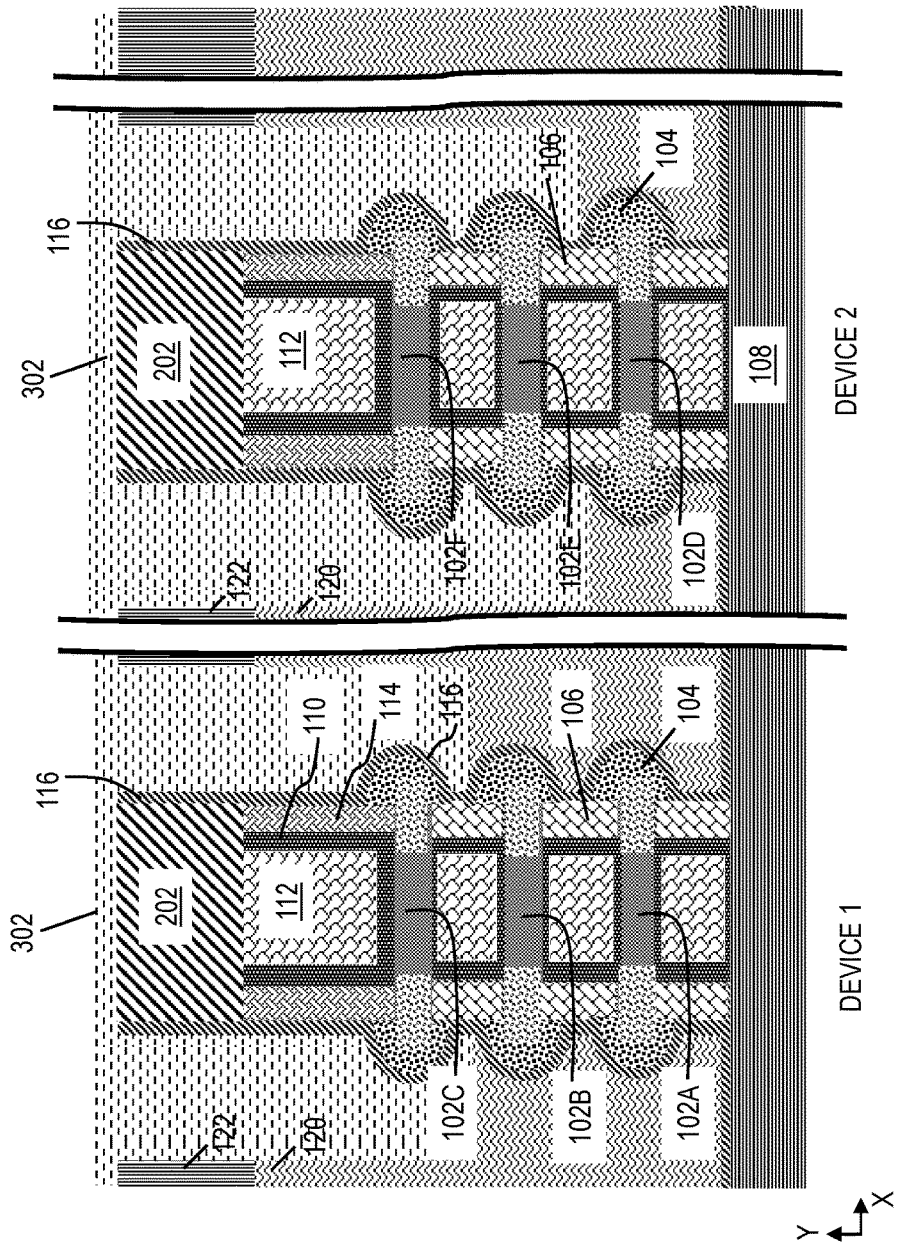

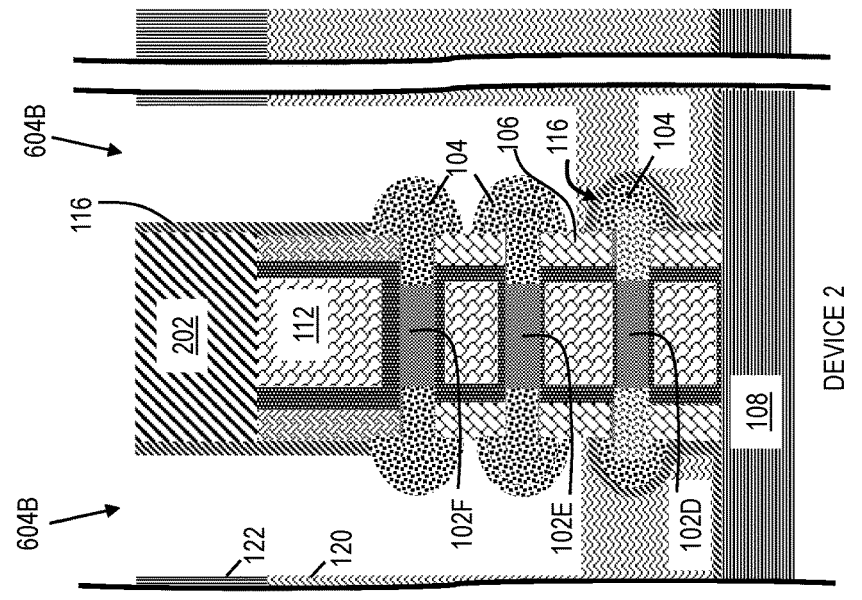
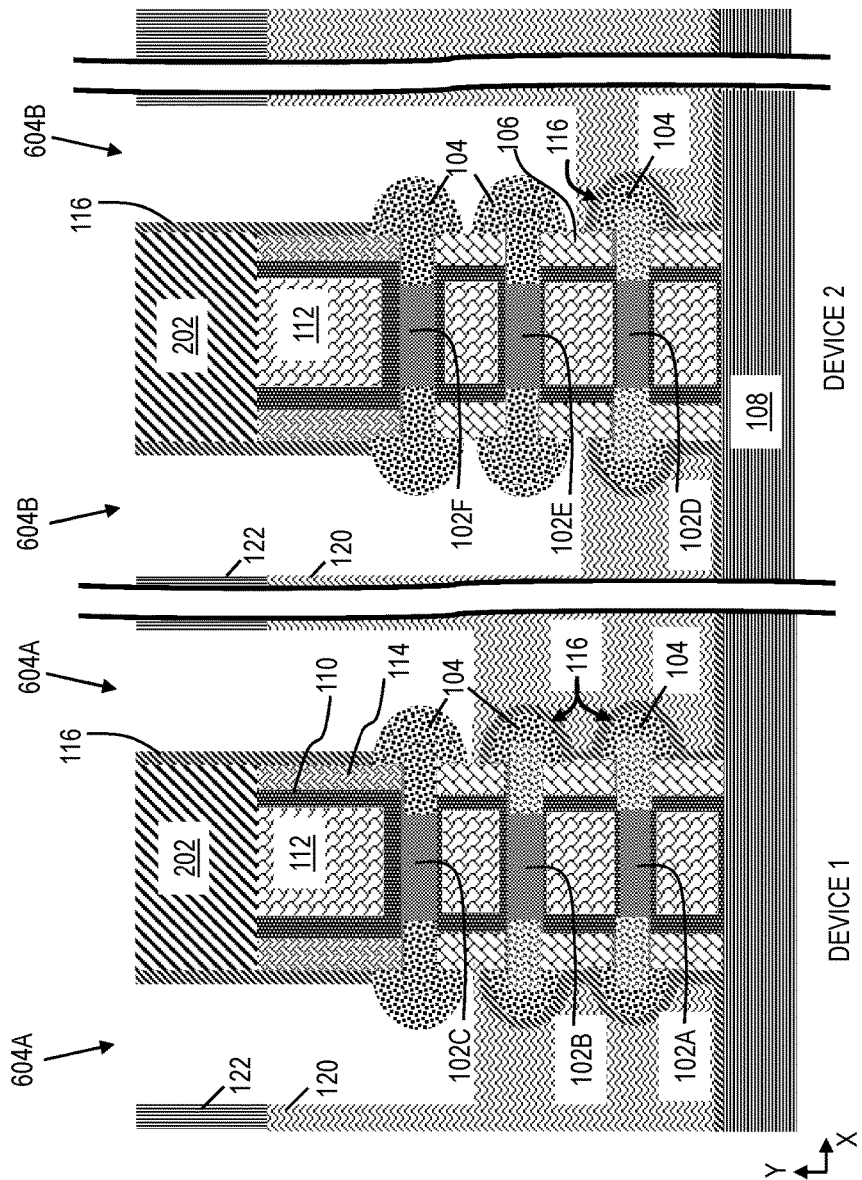

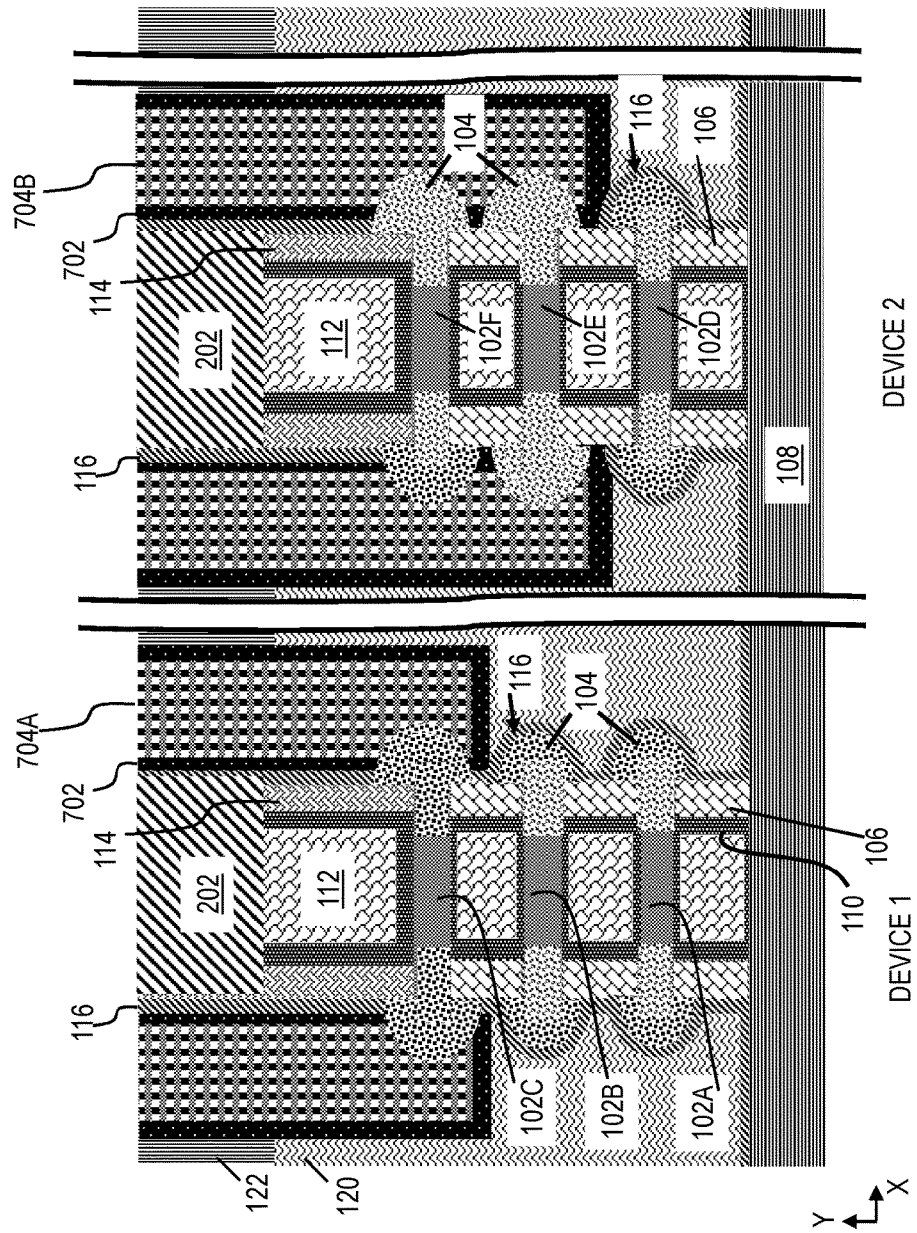

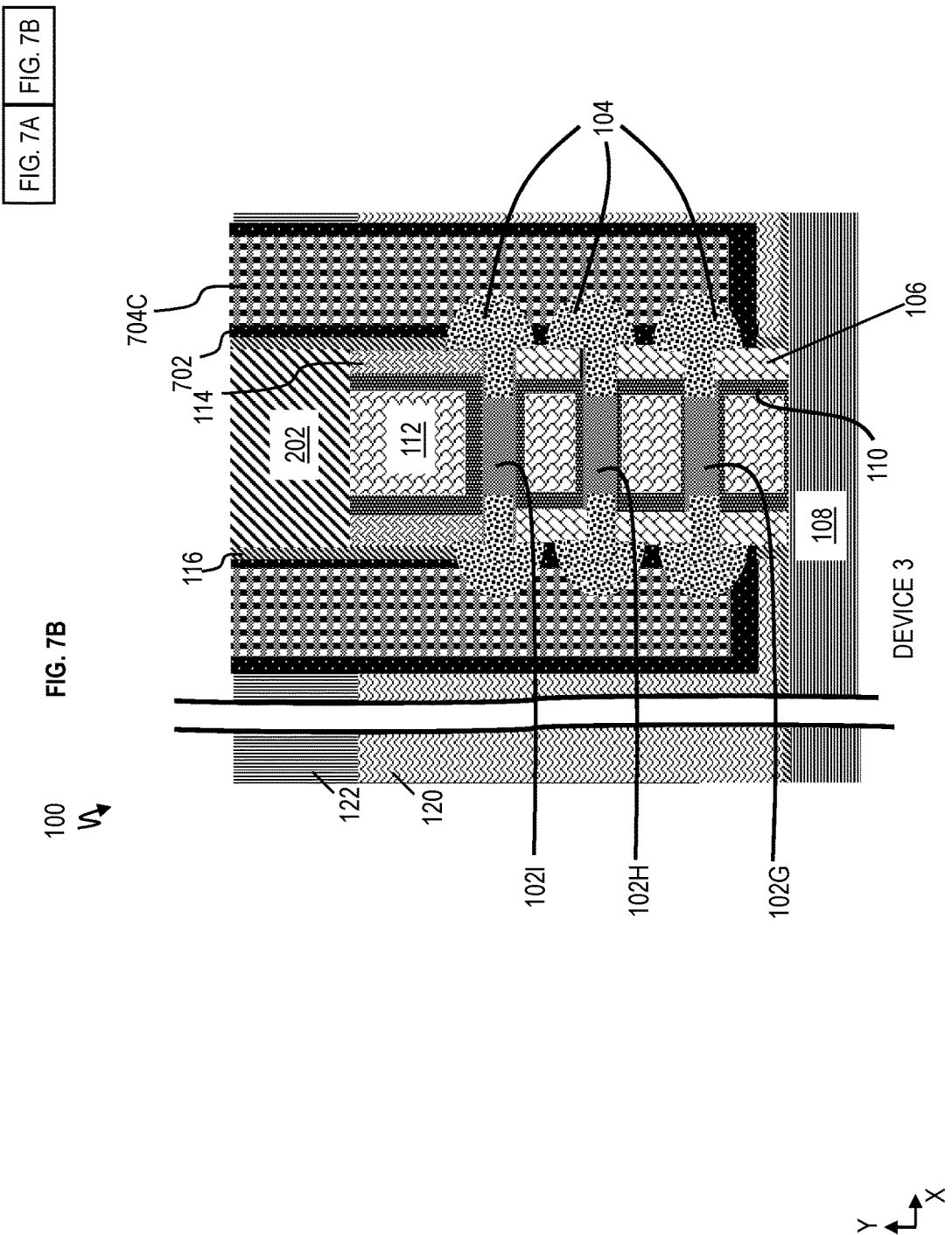

MULTIPLE WIDTH NANOSHEET DEVICES

BACKGROUND

The present invention generally relates to fabrication methods and resulting structures for semiconductor devices, and more specifically, to multiple width nanosheet devices.

A metal-oxide-semiconductor field-effect transistors (MOSFET) is used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

The nanowire or nanosheet MOSFET is a type of non-planar MOSFET that uses multiple stacked nanowires/nanosheets to form multiple channel regions. The gate regions of a nanosheet MOSFET are formed by wrapping gate stack materials around the multiple nanowire/nanosheet channels. This configuration is known as a gate-all-around (GAA) FET structure. The nanowire/nanosheet MOSFET device mitigates the effects of short channels and reduces drain-induced barrier lowering.

SUMMARY

Embodiments of the invention are directed to a method for forming a semiconductor device. A non-limiting example of the method includes forming a first stack including a first plurality of nanowires respectively coupled to first source and drain regions, and a second stack including a second plurality of nanowires respectively coupled to second source and drain regions. The method includes forming first source and drain contacts to couple to a first predefined number of the first plurality of nanowires and forming second source and drain contacts to couple to a second predefined number of the second plurality of nanowires, where the first predefined number is different from the second predefined number.

Embodiments of the invention are directed to a semiconductor device. A non-limiting example of the semiconductor device includes a first stack having a first plurality of nanowires respectively coupled to first source and drain regions, and a second stack having a second plurality of nanowires respectively coupled to second source and drain regions. The device includes first source and drain contacts electrically coupled to a first predefined number of the first plurality of nanowires in the first stack and second source and drain contacts electrically coupled to a second predefined number of the second plurality of nanowires, where the first predefined number is different from the second predefined number.

Embodiments of the invention are directed to a method for forming a semiconductor device. A non-limiting example of the method includes forming a first stack having a first plurality of nanowires respectively coupled to first source and drain regions, and a second stack having a second plurality of nanowires respectively coupled to second source and drain regions. The method includes forming first trenches exposing first select ones of the first source and drain regions, the first select ones of the first source and drain regions being coupled to a first predefined number of the first plurality of nanowires. The method includes forming second trenches exposing second select ones of the second source and drain regions, the second select ones of the second source and drain regions being coupled to a second predefined number of the second plurality of nanowires. Further, the method includes forming first source and drain contacts to couple to the first predefined number of the first plurality of nanowires via the first select ones of the first source and drain regions. Also, the method includes forming second source and drain contacts to couple to the second predefined number of the second plurality of nanowires via the second select ones of the second source and drain regions, wherein the first predefined number is different from the second predefined number.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1B depicts a cross-sectional view of the semiconductor device after initial fabrication processing according to embodiments of the invention;

FIG. 2A depicts a cross-sectional view of the semiconductor device after fabrication processing according to embodiments of the invention;

FIG. 3B depicts a cross-sectional view of the semiconductor device after fabrication processing according to embodiments of the invention;

FIG. 3C depicts a simple diagram of a top view of the semiconductor device after fabrication processing according to embodiments of the invention;

FIG. 4A depicts a cross-sectional view of the semiconductor device after fabrication processing according to embodiments of the invention;

FIG. 4C depicts a simple diagram of a top view of the semiconductor device after fabrication processing according to embodiments of the invention;

FIG. 5A depicts a cross-sectional view of the semiconductor device after fabrication processing according to embodiments of the invention;

FIG. 6A depicts a cross-sectional view of the semiconductor device after fabrication processing according to embodiments of the invention;

FIG. 7A depicts a cross-sectional view of the semiconductor device after fabrication processing according to embodiments of the invention; and FIG. 7B depicts a cross-sectional view of the semiconductor device after fabrication processing according to embodiments of the invention.

Figure 1A:
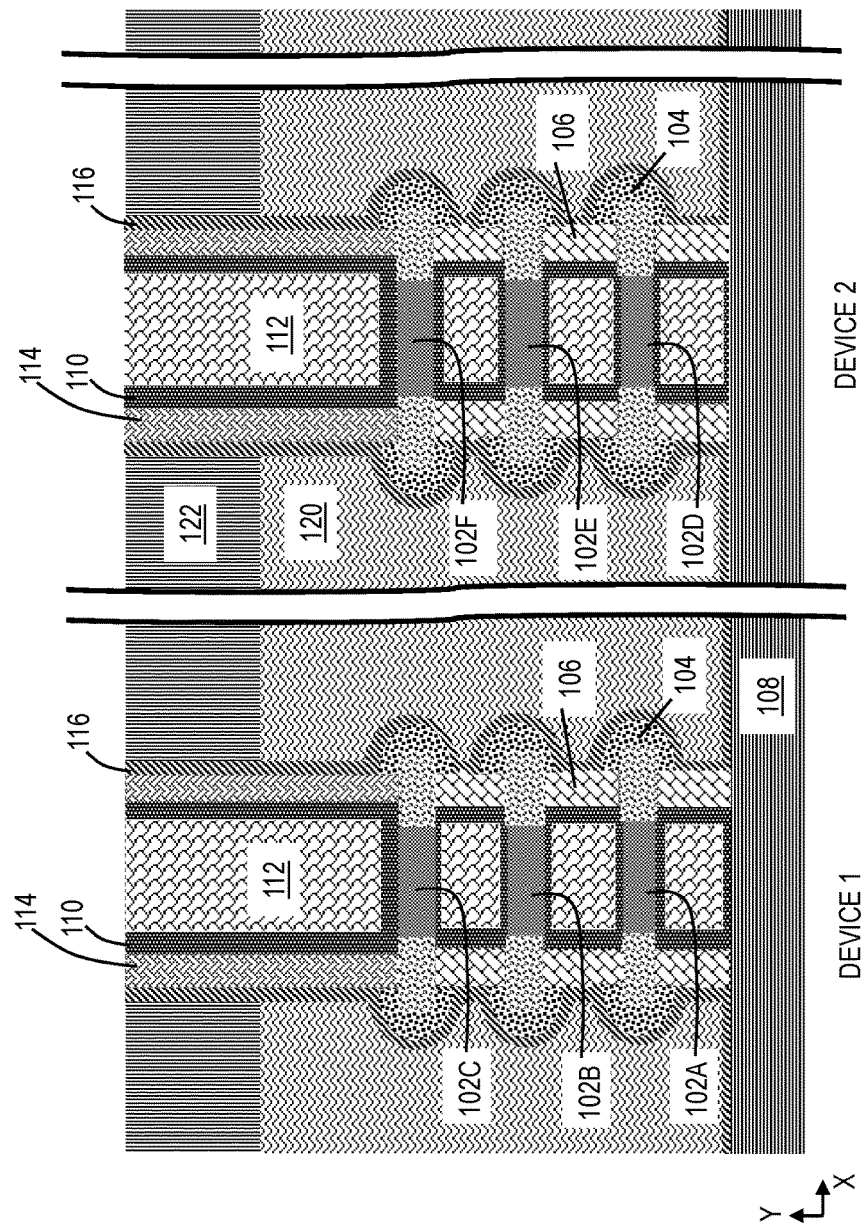
FIG. 1A depicts a cross-sectional view of a semiconductor device after initial fabrication processing according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, gate-all-around (GAA) nanosheet FET structures can provide superior electrostatics. In contrast to known Fin-type FET (FinFET) structures in which the fin element of the transistor extends "up" out of the transistor, nanosheet FET designs implement the fin as a silicon nanosheet/nanowire. In a known configuration of a GAA nanosheet FET, a relatively small FET footprint is provided by forming the channel region as a series of nano sheets (i.e., silicon nanowires). A known GAA configuration includes a source region, a drain region, and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. Sacrificial nanosheets are released from the channel nanosheets before the nanosheet FET device is finalized.

Nanosheet transistors are promising candidate for 5 nm and beyond (i.e., smaller) nodes. FinFET width and nanosheet device widths are quantized (fixed). Accordingly, it can be a challenge to provide nanosheet devices with different device widths on the same substrate. Therefore, there is a need for innovation in producing nanosheet transistors with different device widths. The device width is the combined nanosheet/nanowire thickness of the active channels/nanochannels in a nanosheet stack/device.

Turning now to an overview of the aspects of the invention, one or more embodiments of the invention provide semiconductor devices and a method of forming the semiconductor devices. Embodiments of the invention provide methods and structures with multiple width nanosheet devices to address issues above. Particularly, multiple contact depths are utilized to form different width nanosheet devices such that the source and drain contacts are arranged to contact predefined source and drain regions. The nanosheet width or thickness affects the nanosheet channel which carries electrons between the source and drain regions such that the source and drain contacts have a depth that reaches the desired number of source and drain regions.

Turning now to a more detailed description of aspects of the present invention, FIG. 1A depicts a cross-sectional view of a semiconductor device 100. FIG. 1B depicts a cross-sectional view of the semiconductor device 100 according to embodiments of the invention. The combination of FIGS. 1A and 1B illustrates an example of three devices, for example, nanosheet devices, 1, 2, and 3, on the same substrate 108 of semiconductor device 100. Each of the nanosheet devices 1, 2, and 3 is an individual stack. Standard lithographic processes can be utilized to fabricate the semiconductor device 100 as understood by one skilled in the art.

After initial fabrication processing, the semiconductor device 100 includes nanosheets/nanochannels/nanowires 102A, 102B, 102C, 102D, 102E, 102F, 102G, 102H, and 102I, which can generally be referred to a nanosheets/nanochannels 102. The nanosheets/nanochannels 102 are formed over the substrate 108. The substrate 108 can be an insulating material. The substrate 108 can be an undoped dielectric layer, for example, silicon dioxide ($SiO_2$). The substrate 108 can be an undoped semiconductor material, such as silicon. Although three nanowires/nanosheets 102 are illustrated for explanation purposes, the nanosheet stacks/devices 1, 2, 3 can each have three or more nanowires/nanosheets, such as 3, 4, 5, 6, 7, etc., and any desired number can be active according to the depths of the source and drain contacts 704A, 704B, and 704C as discussed in FIGS. 7A and 7B.

Example materials for the nanosheets/nanochannels 102 can include semiconductor materials, for example, silicon. The nanosheets/nanochannels 102 can be doped or undoped. When doped, the nanosheet/nanowire layers can include "P" type dopants such as boron, aluminum, gallium, and indium, or "N" type dopants such as phosphorus, arsenic, antimony, etc. Other materials or combinations of materials can also be used. Other non-limiting examples of semiconductor materials for the nanosheet/nanowire 102 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. In some embodiments of the invention, the thickness of the nanosheet/nanowire 102 can be about 3 nm to about 20 nm thick. In some embodiments of the invention, the thickness of the nanosheet/nanowire layers 102 can be between about 10 nm to about 12 nm. Greater and smaller thicknesses are also contemplated.

Source and drain regions 104 are physically and electrically coupled to both ends of the nanosheets/nanochannels 102, thereby forming channels for conducting electricity in between. The source/drain regions 104 can be epitaxially grown from the nanosheets/nanochannels 102 and are semiconductor material. The source/drain regions 104 can be doped with P-type dopants or N-type dopants as desired. Each device 1, 2, and 3 is shown with three source and drain regions 104, for example, a top, middle, and bottom but fewer or more can be included to respectively accommodate fewer or more nanosheets/nanowires 102 per stack.

Inner spacers 106 are formed to separate the source and drain 104, source and drain contacts 704A, 704B, 704C, and metal liner 702 (depicted in FIGS. 7A and 7B) from the high-k dielectric material 110 and gate metal 112. The inner spacers 106 can be, for example, silicon nitride (SiN). As other examples, the inner spacers 106 can be an oxide or nitride material.

The combination/stack of the high-k dielectric material 110 and gate metal 112 together form the "gate" or gate structure. The gate metal 112 can include, for example, tungsten (W). The gate metal 112 can include one or more work function metals. The type of work function metal depends on the type of transistor and can differ between the NFET and the PFET. Accordingly, the work function metal can include P-type metals used for PFETs and N-type metals used for NFETs. P-type work function materials include compositions such as ruthenium, palladium, platinum, cobalt, nickel, and conductive metal oxides, conductive nitrides such as TiN, conductive carbide such as TiC or TiAlC, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, conductive nitrides such as TiN, or any combination thereof.

The high-k dielectric material 110 can include one or more high-k materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. High-k dielectric materials can have a dielectric constant greater than 3.9, 7.0, or 10.0.

A gate spacer 114 is formed on the sides of the high-k dielectric material 110. The gate spacer 114 can be, for example, an oxide or nitride material. Particularly, the gate spacer 114 is a low-k dielectric material such as SiOCN, SiBCN, etc.

A liner 116 is formed on the gate spacer 114 and around the source/drain regions 104. The liner 116 protects the source/drain regions 104 during processing. The liner 116 should be a high quality nitride, for example, furnace SiN.

An inter-layer (or inter-level) dielectric (ILD) material 120 is formed on the liner 116. The ILD material 120 is a low-k dielectric material and can be, for example, an oxide material. The ILD material 120 can be a flowable oxide (FOX®) which is a low density spin-on material. An upper dielectric material 122 is formed on top of the ILD material 120 and can be an oxide. For example, the upper dielectric material 122 can be a high density plasma oxide (HDP) which is deposited by HDP chemical vapor deposition (CVD).

Figure 2B:
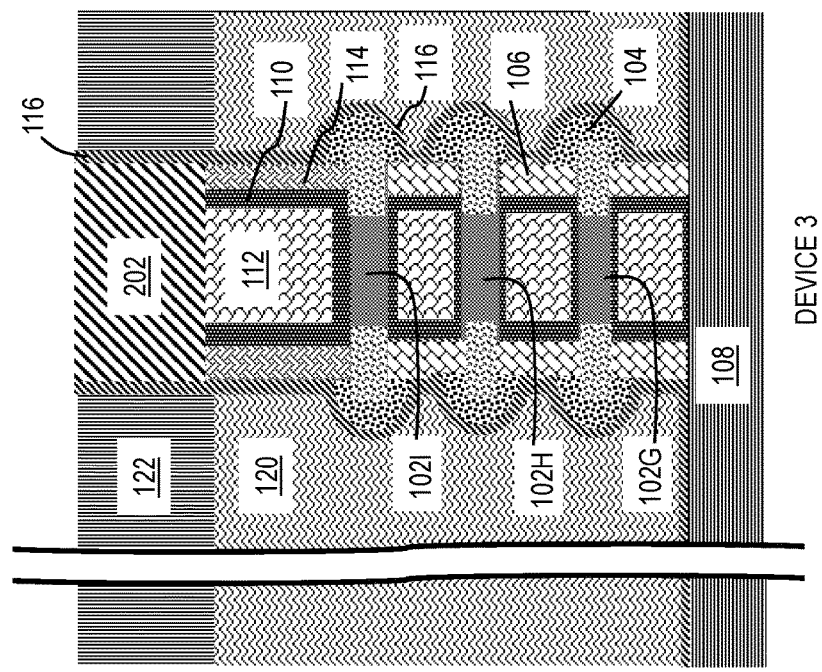
FIG. 2B depicts a cross-sectional view of the semiconductor device after fabrication processing according to embodiments of the invention.

FIG. 2A depicts a cross-sectional view of the semiconductor device 100 after fabrication processing according to embodiments of the invention. FIG. 2B depicts a cross-sectional view of the semiconductor device 100 after fabrication processing according to embodiments of the invention. The high-k dielectric material 110, the gate metal 112, and the gate spacer 114 are recessed so as to leave an opening (not shown), while the liner 116 is not recessed. A gate (or SAC) cap 202 is formed on top of the high-k dielectric material 110, the gate metal 112, and the gate spacer 114. Chemical mechanical polishing/planarization is performed to stop on the upper dielectric material 122. The gate cap 202 is an insulator, and the gate cap 202 can be an undoped dielectric material, such as, HDP silicon nitride. Other example materials for the gate cap 202 can include SiOCN, SiOC, SiC, SIBCN, SiCN, BN, SiON, and combinations thereof.

Figure 3A:
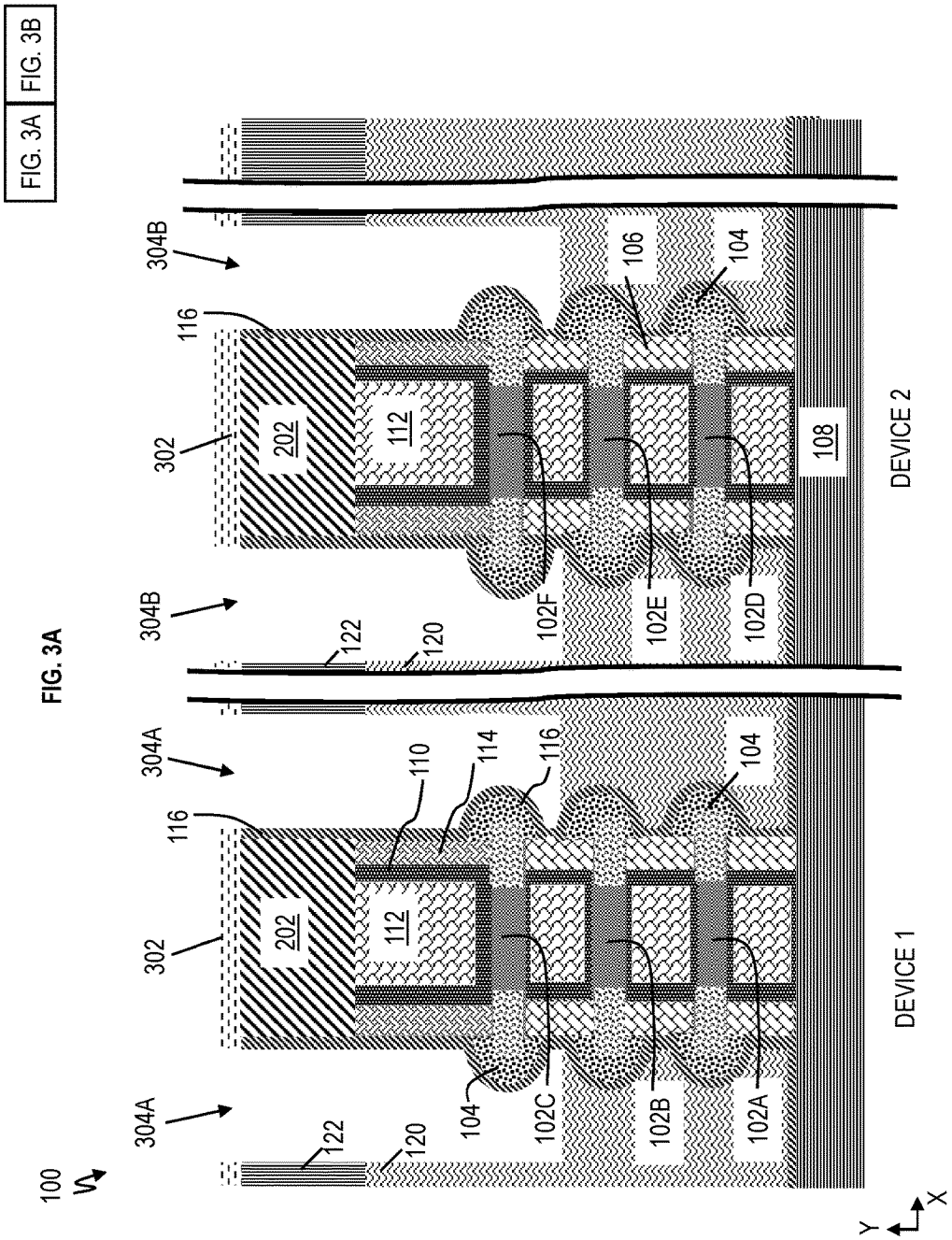
FIG. 3A depicts a cross-sectional view of the semiconductor device after fabrication processing according to embodiments of the invention.

FIG. 3A depicts a cross-sectional view of the semiconductor device 100 after fabrication processing according to embodiments of the invention. FIG. 3B depicts a cross-sectional view of the semiconductor device 100 after fabrication processing according to embodiments of the invention. FIG. 3C depicts a simple diagram of a top view of the semiconductor device 100 after fabrication processing according to embodiments of the invention.

Material of a block mask 302 is deposited on top of the semiconductor device 100, for example, on top of the liner 116, the upper dielectric material 122, and the gate cap 202. The block mask 302 can be, for example, organic planarization layer (OPL) or another suitable material.

As seen in FIGS. 3A, 3B, and 3C, etching (e.g., reactive ion etching (RIE)) is performed to open trenches 304A for device 1 (nanosheet stack), trenches 304B for device 2 (nanosheet stack), and trenches 304C for device 3 (nanosheet stack). At this point each of the trenches 304A, 304B, and 304C have the same or about the same depth in the y-axis, for example, a first depth. For device 1, the trenches 304A are in preparation for self-aligned contacts to contact the top source and drain regions 104, and the trenches 304A will be reopened to the first depth.

Figure 4B:
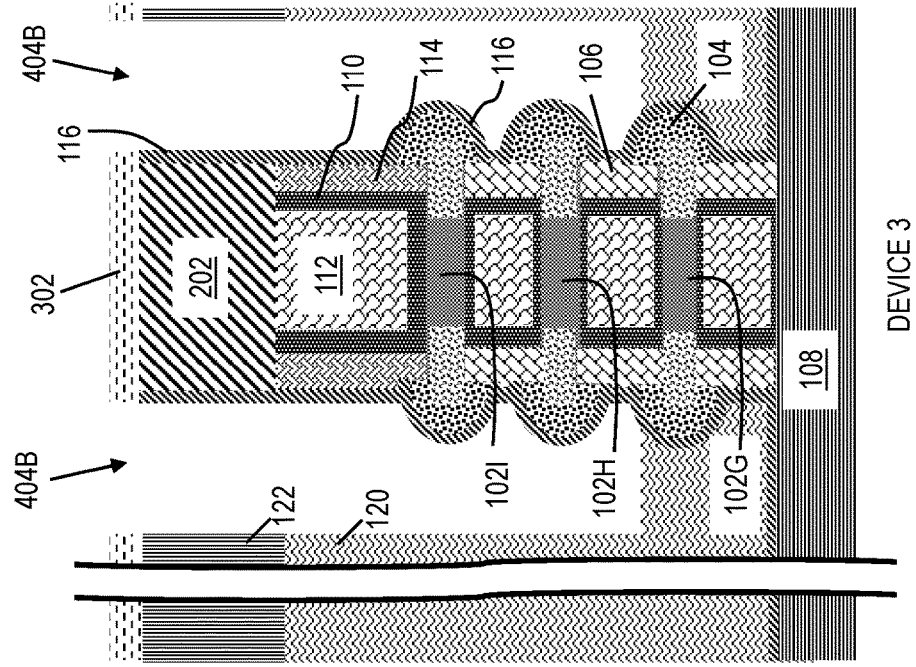
FIG. 4B depicts a cross-sectional view of the semiconductor device after fabrication processing according to embodiments of the invention.

FIG. 4A depicts a cross-sectional view of the semiconductor device 100 after fabrication processing according to embodiments of the invention. FIG. 4B depicts a cross-sectional view of the semiconductor device 100 after fabrication processing according to embodiments of the invention. FIG. 4C depicts a simple diagram of a top view of the semiconductor device 100 after fabrication processing according to embodiments of the invention.

Material of the block mask 302 is redeposited into the trenches 304A, 304B, and 304C from FIGS. 3A, 3B, and 3C, such that the trenches are each filled (not shown). Etching is performed to reopen the previous locations of trenches 304B and 304C, which are now designated as trenches 404A and 404B respectively, while the previous location of trenches 304A remains filled in for device 1. As seen in FIGS. 4A and 4B, further etching is performed to create trenches 404A and 404B to a second depth in the y-axis, where the second depth is greater than the first depth. For device 2, the trenches 404A are in preparation for self-aligned contacts to contact the top and middle source and drain regions 104, and the trenches 404A will be reopened to the second depth.

Figure 5B:
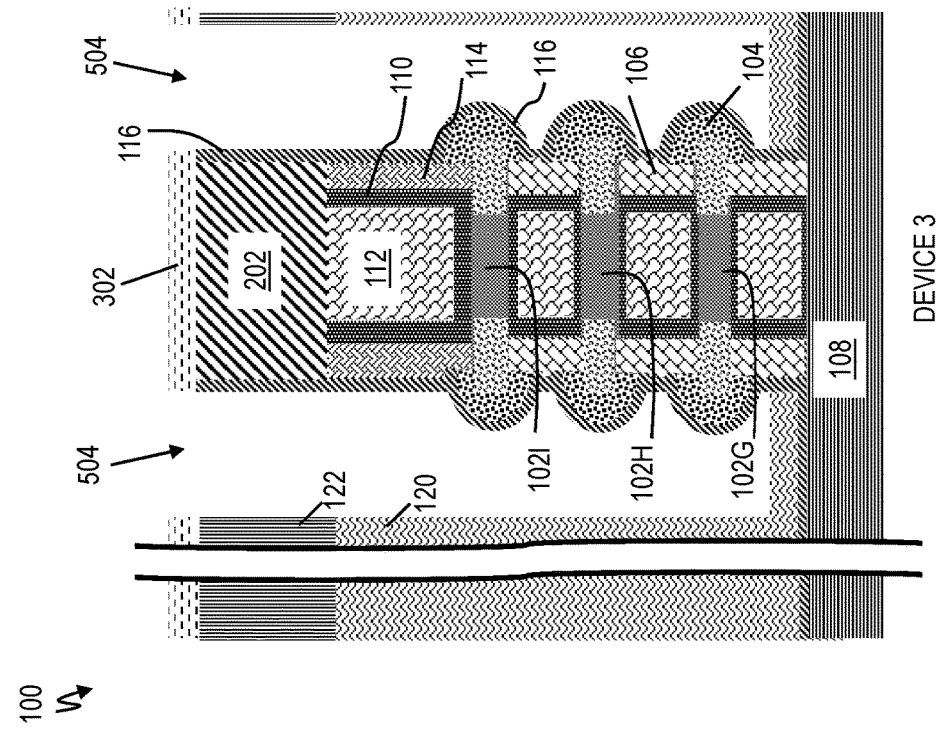
FIG. 5B depicts a cross-sectional view of the semiconductor device after fabrication processing according to embodiments of the invention.
Figure 5C:
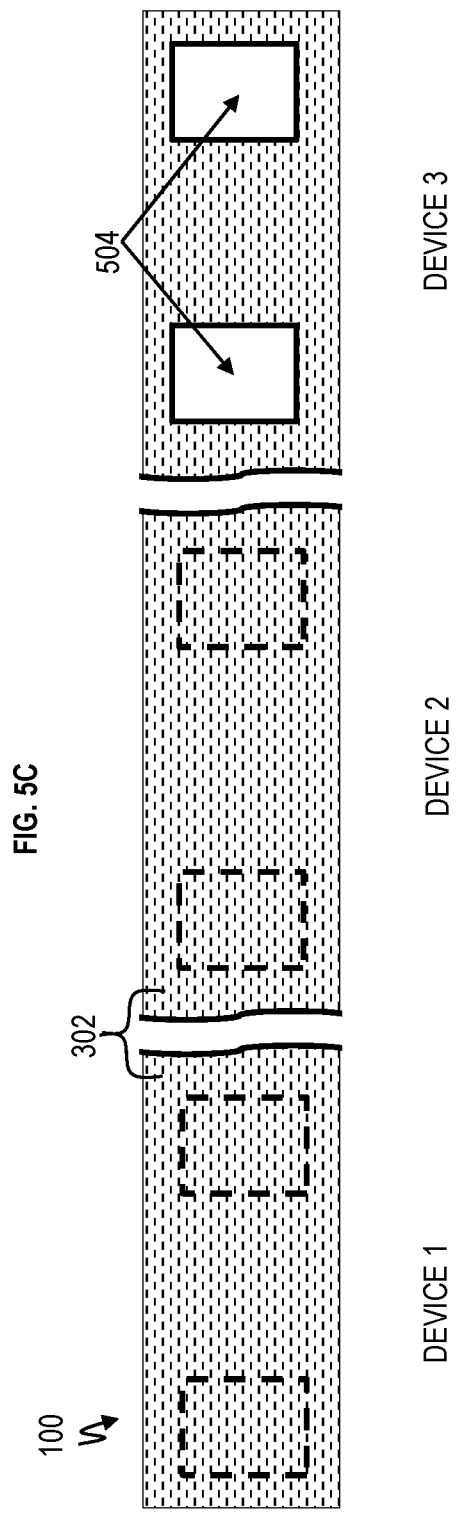
FIG. 5C depicts a simple diagram of a top view of the semiconductor device after fabrication processing according to embodiments of the invention.

FIG. 5A depicts a cross-sectional view of the semiconductor device 100 after fabrication processing according to embodiments of the invention. FIG. 5B depicts a cross-sectional view of the semiconductor device 100 after fabrication processing according to embodiments of the invention. FIG. 5C depicts a simple diagram of a top view of the semiconductor device 100 after fabrication processing according to embodiments of the invention.

Material of the block mask 302 is redeposited into the trenches 404A and 404B of respective devices 2 and 3 from FIGS. 4A, 4B, and 4C, such that the trenches are refilled (not shown). It is noted that the previous location of trenches 304A were not reopened and remained filled in. Etching is performed to reopen the previous location of trenches 404B, which are now designated as trenches 504, while the previous location of trenches 404A remains filled in for device 2. As seen in FIGS. 5A and 5B, further etching is performed to create trenches 504 to a third depth in the y-axis, where the third depth is greater than the second depth. For device 3, the trenches 504 are in preparation for self-aligned contacts to contact the top, middle, and bottom source and drain regions 104, and the trenches 504 will be remain open.

Figure 6B:
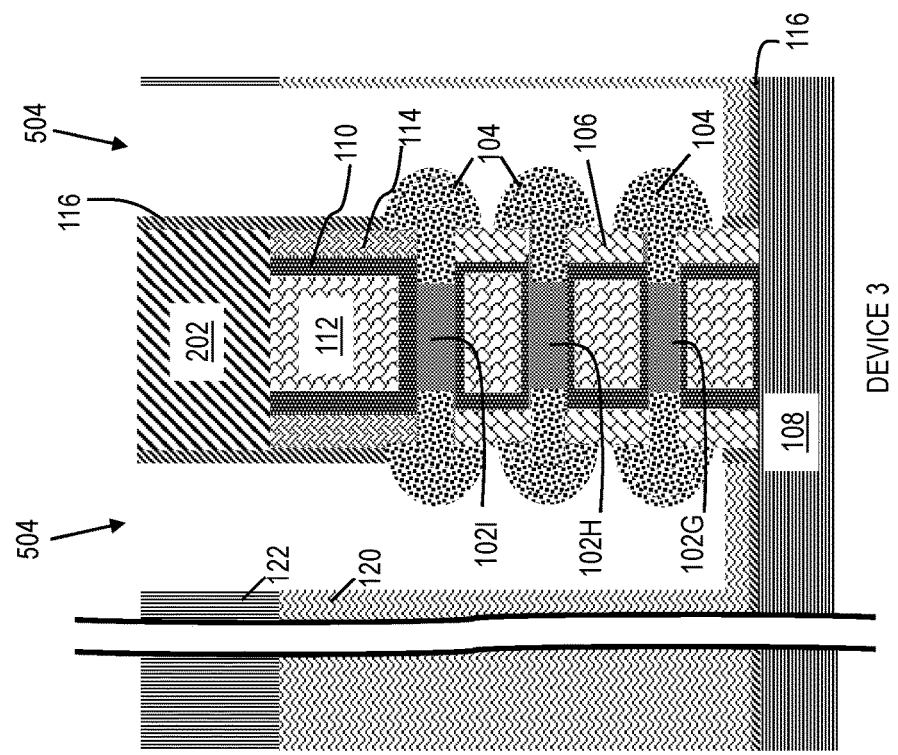
FIG. 6B depicts a cross-sectional view of the semiconductor device after fabrication processing according to embodiments of the invention.

FIG. 6A depicts a cross-sectional view of the semiconductor device 100 after fabrication processing according to embodiments of the invention. FIG. 6B depicts a cross-sectional view of the semiconductor device 100 after fabrication processing according to embodiments of the invention. The material of the block mask 302 is stripped away, such that trenches 604A are opened (i.e., reopen trenches 304A in FIGS. 3A and 3C) to the first depth in the y-axis and trenches 604B are opened (i.e., reopen trenches 404A are reopened) to the second depth. Trenches 504 remain open to the third depth greater than both the first and second depths.

Further, because of the opening in trenches 604A, 604B, and 504, etching is performed to selectively remove the liner 116 around the source and drain regions not covered/protected by the ILD material 120 for each of the devices 1, 2, and 3. Particularly, the liner 116 is removed from the top source and drain regions 104 in device 1, such that the top source and drain regions 104 are now exposed in contact trenches 604A. Similarly, the liner 116 is removed from the top and middle source and drain regions 104 in device 2, such that the top and middle source drain regions 104 are now exposed in contact trenches 604B. Likewise, the liner 116 is removed from the top, middle, and bottom source and drain regions 104 in device 3, such that the top, middle, and bottom source drain regions 104 are now exposed in contact trenches 504. By having each of the contact trenches 604A, 604B, and 504 at different depths which expose a different number of source and drain regions 104, this will provide multiple contact depths thereby allowing devices 1, 2, and 3 to have difference nanosheet device widths, as will be seen in FIGS. 7A and 7B.

As one example to selectively remove the liner 116 (e.g., SiN), gas cluster ion beam (GCIB) processing can be used. Also, a wet clean or wet etch can be performed to further clean the exposed source and drain regions in preparation for depositing the source and drain contacts. It is noted that a portion of the liner 116 can remain on the sides of the gate cap 202 and the gate spacer 114.

FIG. 7A depicts a cross-sectional view of the semiconductor device 100 after fabrication processing according to embodiments of the invention. FIG. 7B depicts a cross-sectional view of the semiconductor device 100 after fabrication processing according to embodiments of the invention. FIGS. 7A and 7B illustrate formation of source and drain contacts with different depths in the y-axis.

A metal liner 702 is formed in the open contact trenches 604A, 604B, and 504. Example materials of the metal liner 702 can include titanium nitride (TiN), tantalum nitride (TaN), hafnium nitride (HfN), niobium nitride (NbN), tungsten nitride (WN), or combinations thereof. Metal is deposited on the metal liner 702 to form the metal source and drain contacts 704A, 704B, and 704C in contact trenches 604A, 604B, and 504, respectively. Example metals of the local connection can include tungsten, copper, cobalt. In some implementations, the metal liner 702 is not utilized. The purpose of the metal liner 702 is to prevent the metal ions from diffusing into the ILD material 120, upper dielectric material 122, etc. In general, the combination of the metal liner 702 with its respective metal source and drain contact 704A, 704B, and 704C can be referred to as the source and contacts for each respective device 1, 2, and 3, By having each of the metal source and drain contacts 704A, 704B, 704C at different depths thereby each connecting to a different number of source and drain regions 104 in their respective devices, device 1 has one active channel 102C (one channel width/thickness in y-axis), device 2 has two active channels 102E and 102F (two channel widths/thicknesses in y-axis), and device 3 has three active channels 102G, 102H, and 102I (three channel widths/thicknesses in y-axis). The greater the number of active channels in a device (e.g., nanosheet stack) directly correlates to a greater flow of electrical currently. Any nanosheet/nanowire that does not have its source and drain regions electrically/physically connected to a source and drain contact is not an active nanochannel. For example, nanosheets/nanowires 102A, 102B are not active channels in device 1, nanosheet/nanowire 102D is not an active channel in device 2, and all nanosheets/nanowires 102G, 102H, 102I are active in device 3. It is presumed that the nanosheets/nanochannels 102 each have the same thickness or substantially the same thickness in the y-axis.

According to embodiments of the invention, a method of forming a semiconductor device 100 is provided. The method includes forming a first stack (e.g., device 1) including a first plurality of nanowires (e.g., nanowires 102A, 102B, 102C) respectively coupled to first source and drain regions 104, and a second stack (e.g., device 2) including a second plurality of nanowires (e.g., nanowires 102D, 102E, 102F) respectively coupled to second source and drain regions 104. The method includes forming first source and drain contacts 704A to (electrically) couple to a first predefined number (e.g., one nanowire 102C) of the first plurality of nanowires (e.g., nanowires 102A, 102B, 102C). Also, the method includes forming second source and drain contacts 704B to (electrically) couple to a second predefined number (e.g., two nanowires 102E, 102F) of the second plurality of nanowires (e.g., nanowires 102D, 102E, 102F), wherein the first predefined number is different from the second predefined number.

Further, the method includes forming a third stack (e.g., device 3) including a third plurality of nanowires (e.g., nanowires 102G, 102H, 102I) respectively coupled to third source and drain regions 104. The method includes forming third source and drain contacts 704C to (electrically) couple to a third predefined number (e.g., all three nanowires 102G, 102H, 102I) of the third plurality of nanowires. The third predefined number is different from the first predefined number and the second predefined number.

The third predefined number (e.g., three nanowires) is greater than the second predefined number (e.g., two nanowires), and the second predefined number is greater than the first predefined number (e.g., one nanowire). The first predefined number of the first plurality of nanowires defines at least one active nanowire (e.g., nanowire 102C) in the first stack (e.g., device 1). The second predefined number of the second plurality of nanowires defines at least one active nanowire (e.g., nanowires 102E and 102F) in the second stack (e.g., device 2). The first source and drain contacts 704A have a first depth (in the y-axis) arranged to (electrically) couple to the first predefined number of the first plurality of nanowires via the first source and drain regions 104.

The second source and drain contacts 104 have a second depth (in the y-axis) arranged to (electrically) couple to the second predefined number of the second plurality of nanowires via the second source and drain regions 104, the first depth being different from the second depth.

According to embodiments of the invention, a method of forming a semiconductor device 100 is provided. The method includes forming a first stack (e.g., device 1) including a first plurality of nanowires (e.g., nanowires 102A, 102B, 102C) respectively coupled to first source and drain regions 104, and a second stack (e.g., device 2) including a second plurality of nanowires (e.g., nanowires 102D, 102E, 102F) respectively coupled to second source and drain regions 104. The method includes forming first trenches 604A exposing first select ones (e.g., top source and drain regions 104 of device 1) of the first source and drain regions, the first select ones of the first source and drain regions being coupled to a first predefined number (e.g., one nanowire 102C) of the first plurality of nanowires. The method includes forming second trenches 604B exposing second select ones (e.g., top and middle source drain regions 104 of device 2) of the second source and drain regions, the second select ones of the second source and drain regions being coupled to a second predefined number (e.g., two nanowires 102E, 102F) of the second plurality of nanowires. Also, the method includes forming first source and drain contacts 704A to (electrically) couple to the first predefined number (e.g., one nanowire 102C) of the first plurality of nanowires via the first select ones (e.g., top source and drain regions 104) of the first source and drain regions. The method includes forming second source and drain contacts 704B to (electrically) couple to a second predefined number (e.g., two nanowires 102E, 102F) of the second plurality of nanowires via the second select ones (e.g., top and middle source drain regions 104) of the second source and drain regions, wherein the first predefined number is different from the second predefined number.

The first predefined number of the first plurality of nanowires defines at least one active nanowire (e.g., nanowire 102C) in the first stack (e.g., device 1) and the second predefined number of the second plurality of nanowires defines at least one active nanowire (e.g., nanowires 102E, 102F) in the second stack (device 2).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a first stack comprising a first plurality of nanowires respectively coupled to first source and drain regions, and a second stack comprising a second plurality of nanowires respectively coupled to second source and drain regions, wherein the first source and drain regions are grown from exposed sidewalls of the first plurality of nanowires and the second source and drain regions are grown from exposed sidewalls of the second plurality of nanowires;
   forming first source and drain contacts to couple to a first predefined number of the first plurality of nanowires, the first source and drain contacts being directly connected to the first source and drain regions; and
   forming second source and drain contacts to couple to a second predefined number of the second plurality of nanowires, the first predefined number being different from the second predefined number, wherein a depth of the first source and drain contacts is different from another depth of the second source and drain contacts.

2. The method of claim 1 further comprising forming a third stack comprising a third plurality of nanowires respectively coupled to third source and drain regions.

3. The method of claim 2 further comprising forming third source and drain contacts to couple to a third predefined number of the third plurality of nanowires.

4. The method of claim 3, wherein the third predefined number is different from the first predefined number and the second predefined number.

5. The method of claim 3, wherein the third predefined number is greater than the second predefined number, and the second predefined number is greater than the first predefined number.

6. The method of claim 1, wherein the first predefined number of the first plurality of nanowires defines at least one active nanowire in the first stack.

7. The method of claim 1, wherein the second predefined number of the second plurality of nanowires defines at least one active nanowire in the second stack.

8. The method of claim 1, wherein the first source and drain contacts comprise a first depth arranged to couple to the first predefined number of the first plurality of nanowires via the first source and drain regions.

9. The method of claim 8, wherein the second source and drain contacts comprise a second depth arranged to couple to the second predefined number of the second plurality of nanowires via the second source and drain regions, the first depth being different from the second depth.

10. A semiconductor device comprising:
   a first stack comprising a first plurality of nanowires respectively coupled to first source and drain regions;
   a second stack comprising a second plurality of nanowires respectively coupled to second source and drain regions, wherein the first source and drain regions are grown from exposed sidewalls of the first plurality of nanowires and the second source and drain regions are grown from exposed sidewalls of the second plurality of nanowires;
   first source and drain contacts electrically coupled to a first predefined number of the first plurality of nanowires in the first stack, the first source and drain contacts being directly connected to the first source and drain regions; and
   second source and drain contacts electrically coupled to a second predefined number of the second plurality of nanowires, the first predefined number being different from the second predefined number, wherein a depth of the first source and drain contacts is different from another depth of the second source and drain contacts.

11. The semiconductor device of claim 10 further comprising a third stack comprising a third plurality of nanowires respectively coupled to third source and drain regions.

12. The semiconductor device of claim 11 further comprising third source and drain contacts coupled to a third predefined number of the third plurality of nanowires in the third stack.

13. The semiconductor device of claim 12, wherein the third predefined number is different from the first predefined number and the second predefined number.

14. The semiconductor device of claim 12, wherein the third predefined number is greater than the second predefined number, and the second predefined number is greater than the first predefined number.

15. The semiconductor device of claim 10, wherein the first predefined number of the first plurality of nanowires defines at least one active nanowire in the first stack.

16. The semiconductor device of claim 10, wherein the second predefined number of the second plurality of nanowires defines at least one active nanowire in the second stack.

17. The semiconductor device of claim 10, wherein the first source and drain contacts comprise a first depth arranged to couple to the first predefined number of the first plurality of nanowires via the first source and drain regions.

18. The semiconductor device of claim 17, wherein the second source and drain contacts comprise a second depth arranged to couple to the second predefined number of the second plurality of nanowires via the second source and drain regions, the first depth being different from the second depth.

19. A method of forming a semiconductor device, the method comprising:
   forming a first stack comprising a first plurality of nanowires respectively coupled to first source and drain regions, and a second stack comprising a second plurality of nanowires respectively coupled to second source and drain regions, wherein the first source and drain regions are grown from exposed sidewalls of the first plurality of nanowires and the second source and drain regions are grown from exposed sidewalls of the second plurality of nanowires;
   forming first trenches exposing first select ones of the first source and drain regions, the first select ones of the first source and drain regions being coupled to a first predefined number of the first plurality of nanowires;
   forming second trenches exposing second select ones of the second source and drain regions, the second select ones of the second source and drain regions being coupled to a second predefined number of the second plurality of nanowires;
   forming first source and drain contacts to couple to the first predefined number of the first plurality of nanowires via the first select ones of the first source and drain regions; and
   forming second source and drain contacts to couple to the second predefined number of the second plurality of nanowires via the second select ones of the second source and drain regions, wherein the first predefined number is different from the second predefined number.

20. The method of claim 19, wherein the first predefined number of the first plurality of nanowires defines at least one active nanowire in the first stack and the second predefined number of the second plurality of nanowires defines at least one active nanowire in the second stack.

* * * * *